United States Patent
Yung

(10) Patent No.: US 6,580,382 B2
(45) Date of Patent: Jun. 17, 2003

(54) PROGRAMMABLE GAIN ANALOG-TO-DIGITAL CONVERTER

(75) Inventor: Henry Tin-Hang Yung, Hsin Chu (TW)

(73) Assignee: Mstar Semiconductor, Inc., Hsien (TW)

(*) Notice: Subject to any disclaimer, the term of this patent is extended or adjusted under 35 U.S.C. 154(b) by 0 days.

(21) Appl. No.: 10/142,698

(22) Filed: May 8, 2002

(65) Prior Publication Data

US 2002/0167432 A1 Nov. 14, 2002

Related U.S. Application Data

(60) Provisional application No. 60/290,427, filed on May 11, 2001.

(51) Int. Cl.[7] .................................. H03M 3/00
(52) U.S. Cl. ....................................... 341/139
(58) Field of Search .............................. 341/139, 155, 341/159, 144, 156

(56) References Cited

U.S. PATENT DOCUMENTS 6,255,974 B1 * 7/2001 Morizio ....................... 341/155
6,307,497 B1 * 10/2001 Leung ......................... 341/155

* cited by examiner

Primary Examiner—Brian Young
(74) Attorney, Agent, or Firm—J.C. Patents

(57) ABSTRACT

A multi-stage high-speed analog-to-digital converter with gain and offset adjustment. A programmable amplifier consisting of two capacitor arrays, and digitally controlled switching devices to manipulate an inputted analog signal. A four stage pipeline ADC provides an 8 bit digital output with redundancy and error correction.

4 Claims, 3 Drawing Sheets

PROGRAMMABLE GAIN ANALOG-TO-DIGITAL CONVERTER

CROSS-REFERENCE TO RELATED APPLICATION

This application claims the priority benefit of U.S. provisional application titled "PROGRAMMABLE GAIN ANALOG-TO-DIGITAL CONVERTER" filed on May 11, 2001, Ser. No. 60/290,427. All disclosures of this application is incorporated herein by reference.

BACKGROUND OF THE INVENTION

1. Field of the invention:

The present invention relates to an analog-to-digital converter, and more particularly, to a pipelined 4-stage ADC with digital gain, and offset control.

2. Description of related art

Analog-to-digital converters are circuits commonly used in communications, instrumentation, and consumer devices. A preferred embodiment of the invention utilizes its design in a video-graphics conversion circuit of a flat-panel monitor. Currently most personal computers utilize video cards that convert digital signals into RGB analog signals for displaying graphics on CRT monitors. It is therefore necessary for flat-panel displays to be able to interface with current video graphics systems. FIG. 1 shows a typical flat-panel video graphics conversion circuit. The flat-panel display requires an analog interface 16 to change the analog RGB signals from the RAMDACs 14 into the digital signals required by the graphics controller 18. The RAMDACs 14 are configured at a pixel rate based on the resolution of the screen to convert the digital signals from the graphics processing engine 12 in the PC graphics card 10 into an analog 256-level pulse amplitude modulated signal which is transmitted along with timing signals to the analog interface 16 of the flat panel display. The analog interface 16, which requires high-speed ADCs to convert the data into a digital format for processing, receives the analog graphics data. During the ADC conversion it is also necessary to alter the offset and gain of the signal for adjusting image quality. In a display device, increasing the gain setting results in an image with more contrast. The offset control is independent for the red, green, and blue channels and serves to shift the entire input range, resulting in a change in image brightness. Therefore a need exists for a high-speed, high resolution ADC with offset and gain control, that has low power consumption.

SUMMARY OF THE INVENTION

It is therefore, an object of the present invention to provide a pipelined analog-to-digital converter with offset and gain control. It is also an object to provide a pipelined analog-to-digital converter that has reduced power consumption.

To accomplish these and other objects of the present invention, a 4 stage pipelined analog-to-digital converter with a programmable gain stage is provided. The programmable gain stage comprises two capacitor arrays that serve as digital-to-analog converters. Each capacitor array is composed of a binary-weighted section that is further composed of two stages capacitively coupled together to reduce the capacitor ratios. An input analog signal is inputted to a programmable gain stage wherein the offset and gain of the signal can be manipulated using a digital control. A fully differential signal is then sent to the first stage of the pipeline ADC. The first stage outputs a 1.5 bit digital output and provides an extra gain of 2 to the signal. The extra gain allows the programmable gain stage to use less power, and therefore less power consumption in the overall circuit. The second and third stages each provide 2.5 bit digital outputs each. The final stage provides a 3 bit digital output.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION OF THE PREFERRED EMBODIMENTS

In the following detailed description of the preferred embodiments, reference is made to the accompanying drawings which form a part hereof, and in which is shown by way of illustration specific preferred embodiments in which the invention may be practiced. The preferred embodiments are described in sufficient detail to enable these skilled in the art to practice the invention, and it is to be understood that other embodiments may be utilized and that logical changes may be made without departing from the spirit and scope of the present invention. The following detailed description is, therefore, not to be taken in a limiting sense, and the scope of the present invention is defined only by the appended claims.

Figure 1:
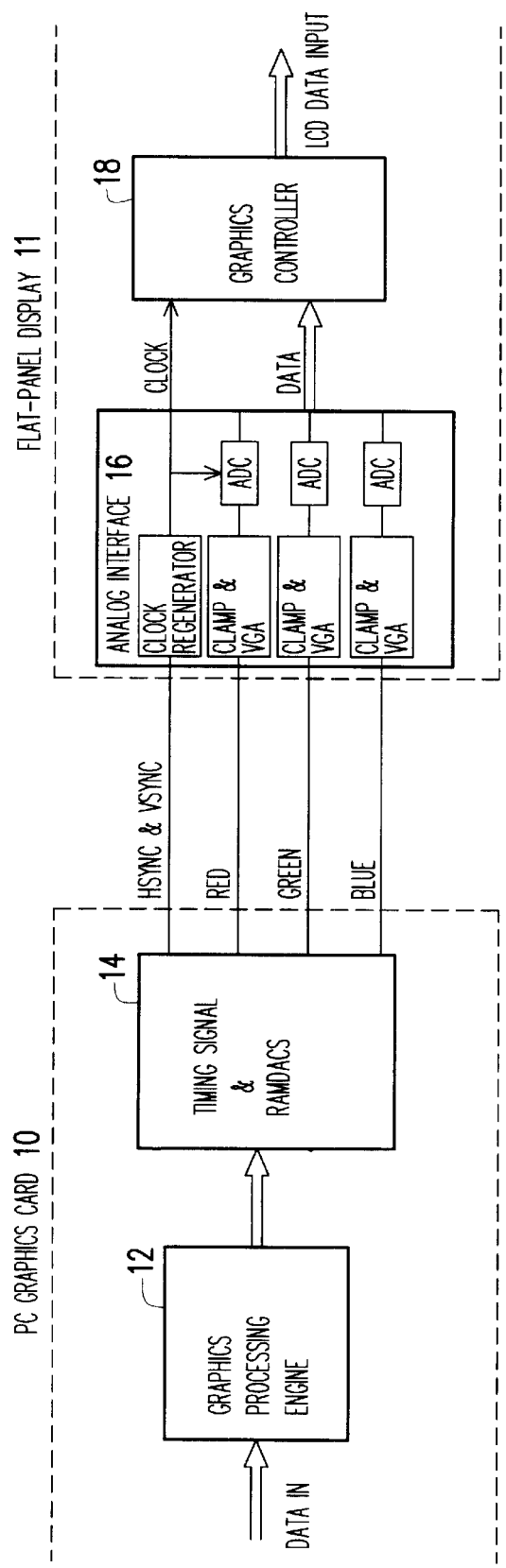
FIG. 1 is a block diagram of the video graphics conversion circuit of the present invention according to a preferred embodiment.
Figure 2:
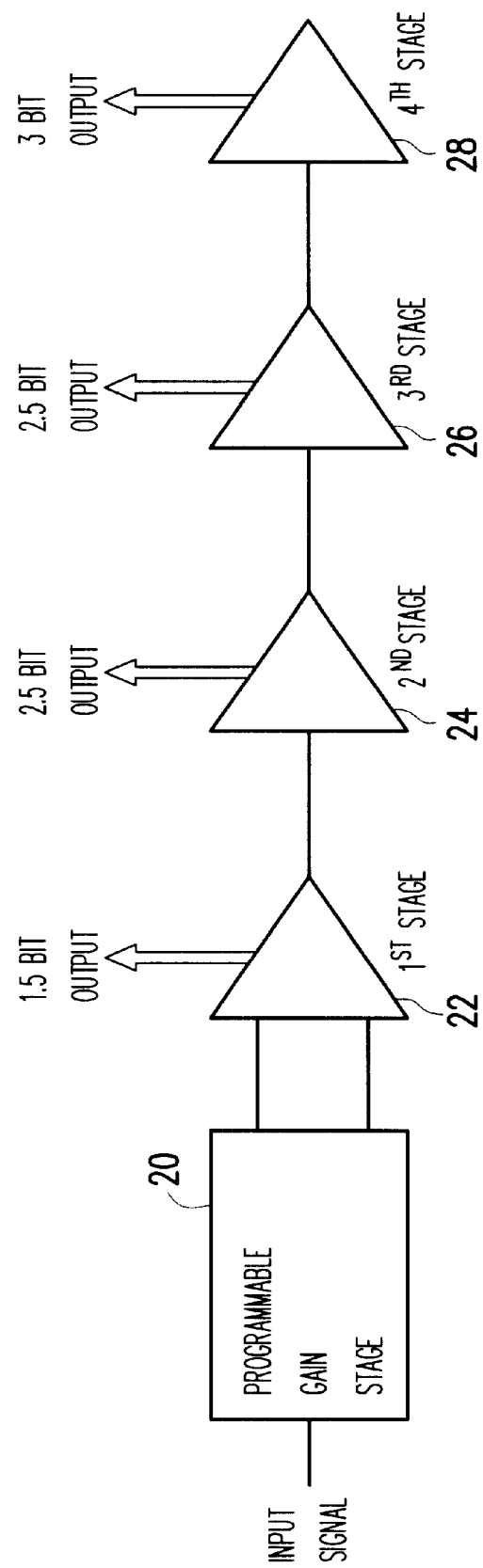
FIG. 2 is a schematic diagram of the multi-stage gain ADC of the present invention according to a preferred embodiment.

FIG. 2 shows a preferred embodiment of the invention. An analog signal is inputted into a programmable gain stage 20. The programmable gain stage 20 outputs a fully differential signal, which is fed into a 4 stage 8-bit pipeline ADC. The $1^{st}$ stage 22 of the ADC pipeline provides a 1.5 bit digital output. The $2^{nd}$ stage 24 and $3^{rd}$ stage 26 each provides a 2.5 bit digital output. The $4^{th}$ stage 28 provides a 3 bit digital output. The extra 0.5 bit in each of the first 3 stages are used for redundancy and error correction. The bits in the 4 different stages are summed together to give a total result of 8 bits. Each stage of the pipelined architecture must also provide a dc gain sufficiently high to ensure that the final settled value of the amplified residue is accurate. The dc gain requirement of the first stage is determined by the resolution of the pipeline ADC. The first stage used in the invention provides an extra gain of 2, reducing power usage in the programmable gain stage 20, therefore reducing overall power consumption.

Figure 3:
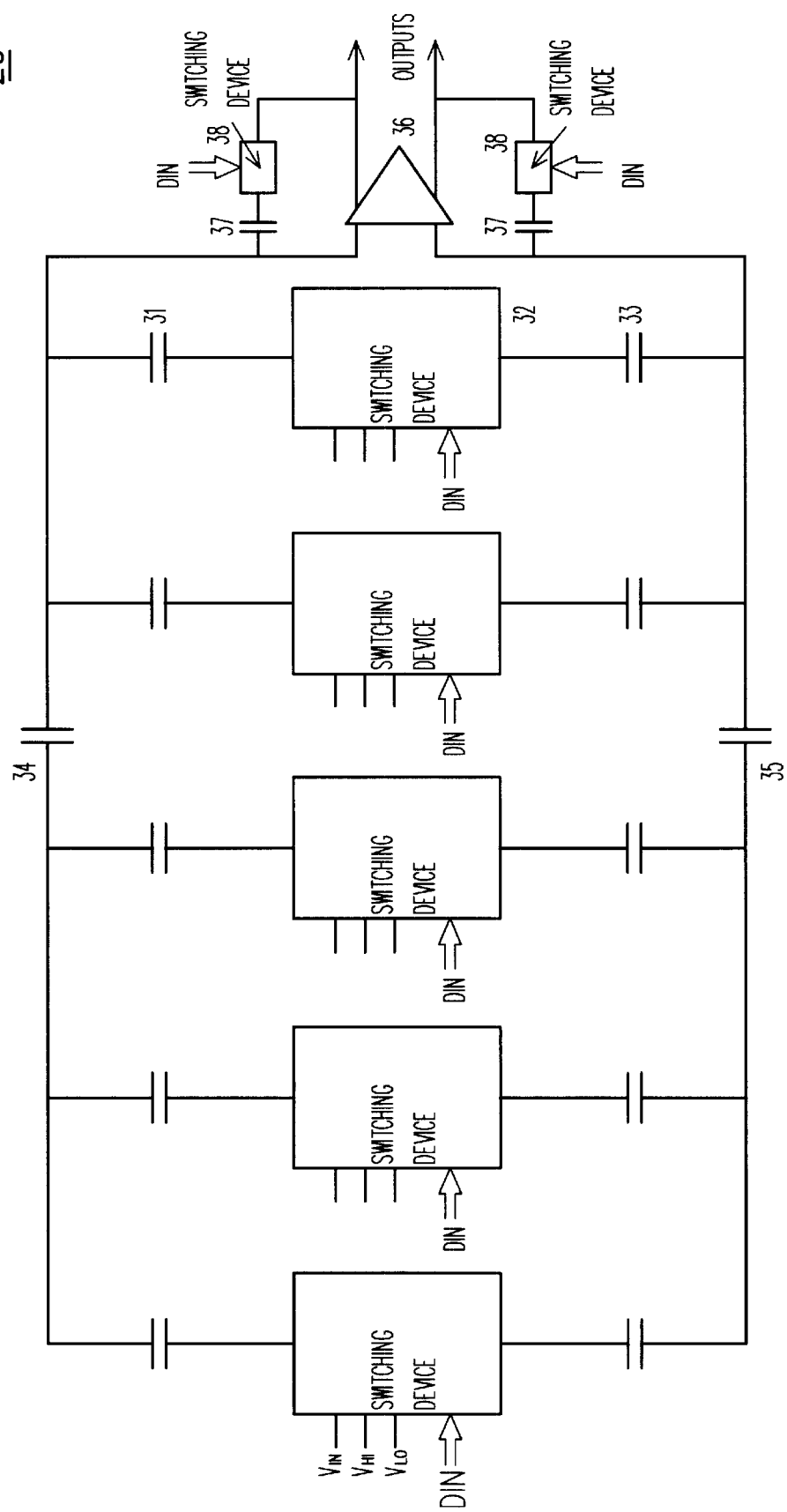
FIG. 3 is a circuit diagram of the programmable gain stage of the present invention according to a preferred embodiment.

FIG. 3 shows the programmable gain stage 20 of the invention that consists of 2 capacitor arrays that serve as digital-to-analog converters. Each capacitor array is composed of a binary-weighted section along with a few additional capacitors. The binary-weighted section is further composed of 2 stages capacitively coupled together by capacitors 34 and 35 to reduce the capacitor ratios. Referring to FIG. 3, only a portion of the capacitor arrays will be discussed in details as each of the subsequent following portions is substantially the same. An upper capacitor 31 and lower capacitor 33 are connected by a switching device 32. The switching device is inputted with an analog signal, a high voltage level, and a low voltage level (also can be a reference ground). The switching device is also inputted with a plurality of digital input signals controlling the internal switches. The internal switches (not shown) serve to connect the upper capacitors 31 and lower capacitors 33 with the input signals. By using appropriately sized capacitors within the array, a proper digital-to-analog conversion is achieved. This allows the control of the gain and offset of the input signal which in a preferred embodiment provides 8 bits or 256 steps of adjustment. The size of the least-significant-bit in offset adjustment is proportional to the full-scale output range which is not affected when the gain is adjusted. The programmable gain stage also provides good common mode rejection by switching the bottom plates of the corresponding capacitors in the two capacitor arrays together during an integration phase. The charges sampled by the capacitor arrays are integrated to capacitors 37 with the help of an amplifier 36 and switching devices 38 that are controlled by a plurality of digital input signals. In this way, the gain stage can sample a single-ended signal and convert it into a differential signal with a prescribed common mode value. The amplifier serves to provide the required gain to the signal.

In another embodiment of the invention, a number of the ADCs described hereinabove are interleaved together to give a higher throughput rate.

Various additional modifications may be made to the illustrated embodiments without departing from the spirit and scope of the invention. Therefore, the invention lies in the claims hereinafter appended.

What is claimed is:

1. A pipelined multi-stage analog-to-digital converter, comprising:

a programmable gain stage for adjusting a gain and an offset of an input analog signal, and providing single-ended to differential conversion, wherein the programmable gain stage further comprising two capacitor arrays and a plurality of digitally controlled switches; and a plurality of stages, wherein each stage providing a plurality of bits for the digital output, and providing gain to the signal.

2. An 8-bit pipelined multi-stage analog-to-digital converter, comprising:

a programmable gain stage for adjusting a gain and an offset of an input analog signal, and providing single-ended to differential conversion, wherein the programmable gain stage further comprising two capacitor arrays and a plurality of digitally controlled switches;

a first stage with means to provide a 1.5 bit digital output and an extra gain of 2, wherein 0.5 bits of the output are used for redundancy and error correction;

a second stage with means to provide a 2.5 bit digital output, wherein 0.5 bits of the output are used for redundancy and error correction;

a third stage with means to provide a 2.5 bit digital output, wherein 0.5 bits of the output are used for redundancy and error correction; and a fourth stage with means to provide a 3 bit digital output.

3. A pipelined multi-stage analog-to-digital converter, comprising:

a programmable gain stage for adjusting a gain and an offset of an input analog signal, and providing single-ended to differential conversion, wherein the programmable gain stage further comprising two capacitor arrays with a binary weighted section comprising 2 stages capacitively coupled together, and a plurality of digitally controlled switches; and a plurality of stages, wherein each stage providing a plurality of bits for the digital output, and providing gain to the signal.

4. An 8-bit pipelined multi-stage analog-to-digital converter, comprising:

a programmable gain stage for adjusting a gain and an offset of an input analog signal, and providing single-ended to differential conversion, wherein the programmable gain stage further comprising two capacitor arrays with a binary weighted section comprising 2 stages capacitively coupled together, and a plurality of digitally controlled switches, a first stage with means to provide a 1.5 bit digital output and an extra gain of 2, wherein 0.5 bits of the output are used for redundancy and error correction;

a second stage with means to provide a 2.5 bit digital output, wherein 0.5 bits of the output are used for redundancy and error correction;

a third stage with means to provide a 2.5 bit digital output, wherein 0.5 bits of the output are used for redundancy and error correction; and a fourth stage with means to provide a 3 bit digital output.

* * * * *